United States Patent [19]
Komatsu

[11] Patent Number: 5,448,132
[45] Date of Patent: * Sep. 5, 1995

[54] ARRAY FIELD EMISSION DISPLAY DEVICE UTILIZING FIELD EMITTERS WITH DOWNWARDLY DESCENDING LIP PROJECTED GATE ELECTRODES

[75] Inventor: Hiroshi Komatsu, Suwa, Japan

[73] Assignee: Seiko Epson Corporation, Japan

[*] Notice: The portion of the term of this patent subsequent to Jul. 20, 2010 has been disclaimed.

[21] Appl. No.: 129,991

[22] Filed: Sep. 30, 1993

Related U.S. Application Data

[60] Division of Ser. No. 73,149, Jun. 3, 1993, Pat. No. 5,412,285, which is a continuation of Ser. No. 790,281, Nov. 7, 1991, abandoned, which is a continuation-in-part of Ser. No. 624,424, Dec. 6, 1990, abandoned.

[51] Int. Cl.⁶ ............................................. H01J 1/30
[52] U.S. Cl. ................................. 313/495; 313/309; 313/336; 313/351
[58] Field of Search ............... 313/309, 336, 351, 495, 313/496, 497

[56] References Cited

U.S. PATENT DOCUMENTS

| | | | |
|---|---|---|---|
| 4,008,412 | 2/1977 | Yuito et al. | 313/309 |
| 4,874,981 | 10/1989 | Spindt | 313/351 |
| 4,908,539 | 3/1990 | Meyer | 313/309 |
| 5,015,912 | 5/1991 | Spindt et al. | 313/309 |
| 5,063,327 | 11/1991 | Brodie et al. | 313/309 |
| 5,229,331 | 7/1993 | Doan et al. | 313/309 |
| 5,229,682 | 7/1993 | Komatsu | 313/336 |

*Primary Examiner*—Sandra L. O'Shea
*Assistant Examiner*—Vip Patel
*Attorney, Agent, or Firm*—W. Douglas Carothers, Jr.; Eric B. Janofsky

[57] ABSTRACT

An array field emitter device utilizes field emission devices disposed in a matrix or array each comprising an opening in an insulating layer with an upwardly extended cathode with a tip disposed centrally within the opening and a gate electrode substantially concentric with each the cathode tip and having a lip extending into the opening forming a downwardly descending lip projection. Such an array display device can be of the multiplex driven type or can be of the active matrix type.

8 Claims, 13 Drawing Sheets

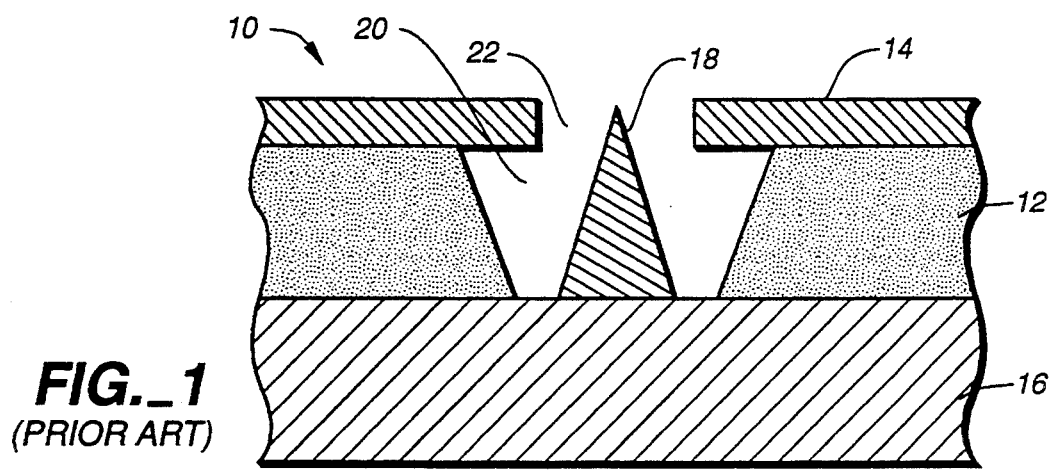
FIG._1
(PRIOR ART)
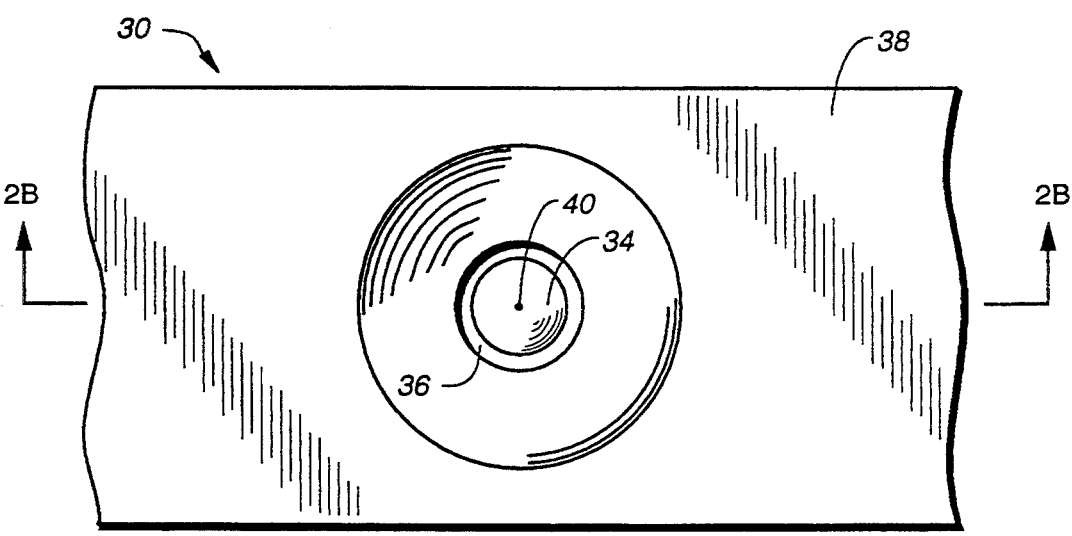
FIG._2A
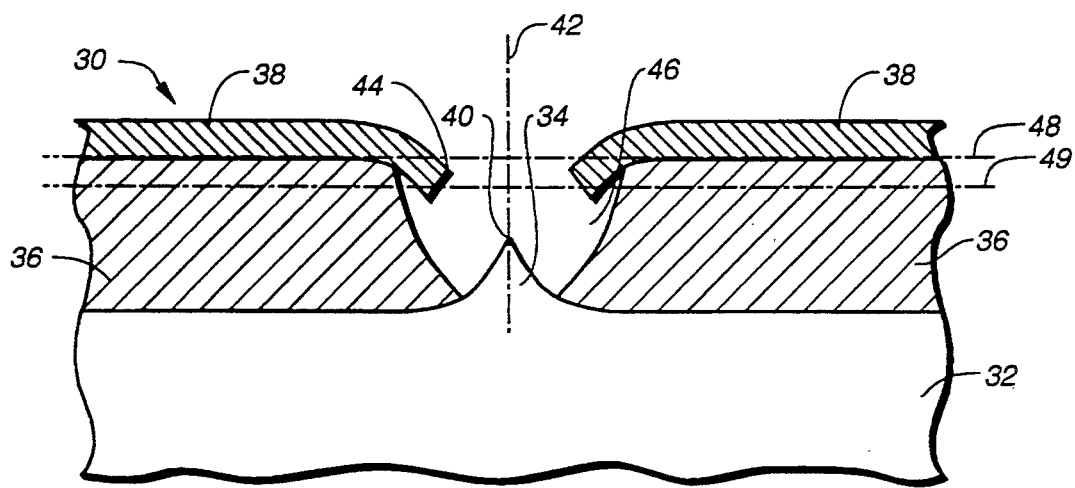
FIG._2B

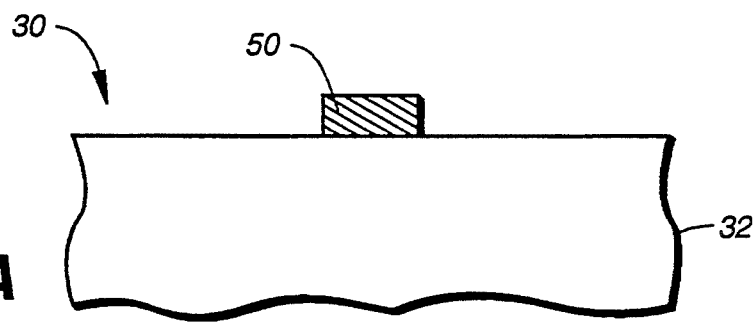
FIG._3A
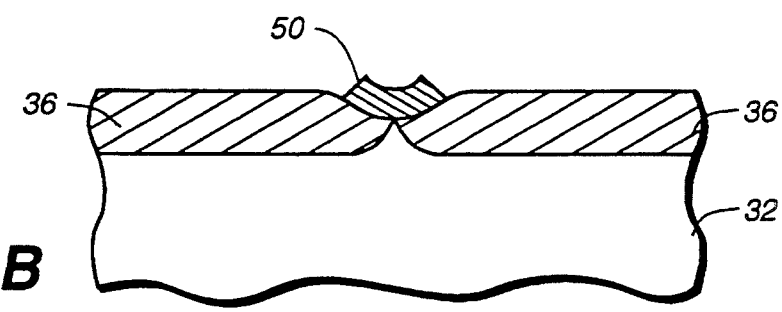
FIG._3B
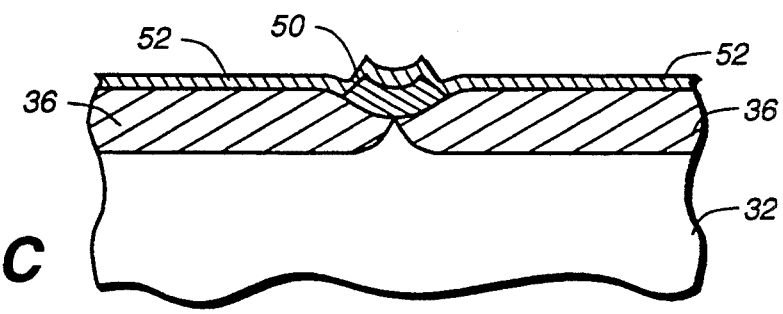
FIG._3C
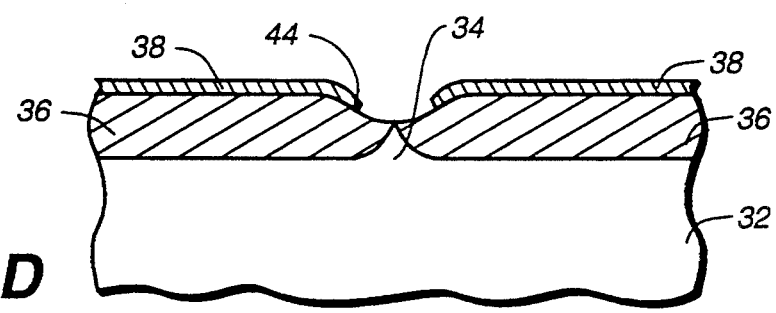
FIG._3D
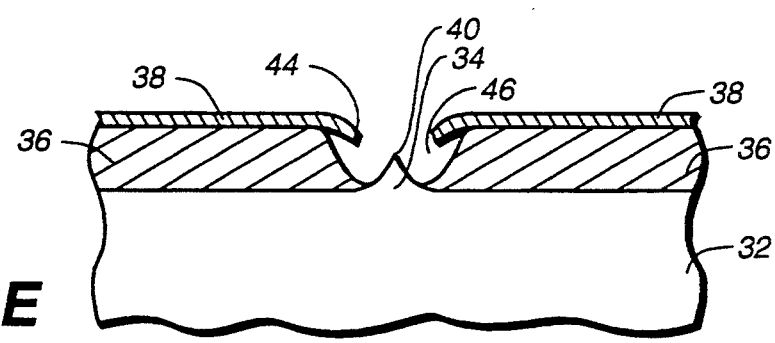
FIG._3E

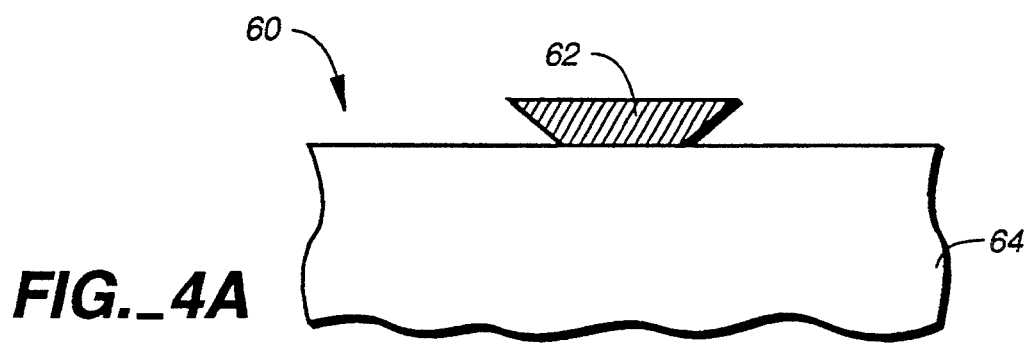
FIG._4A
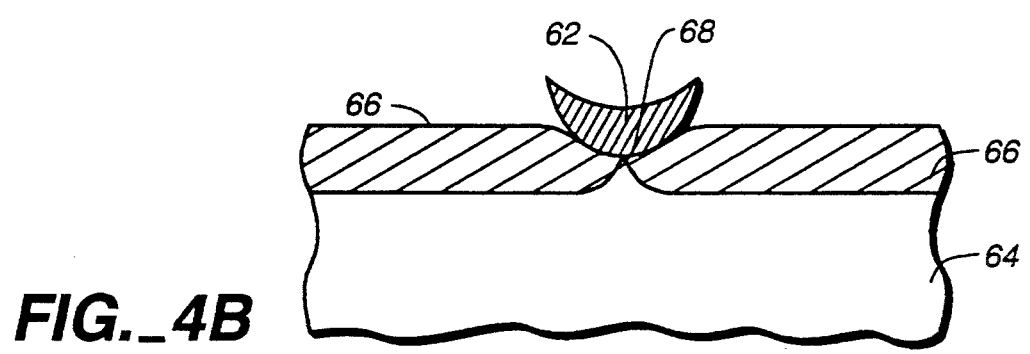
FIG._4B
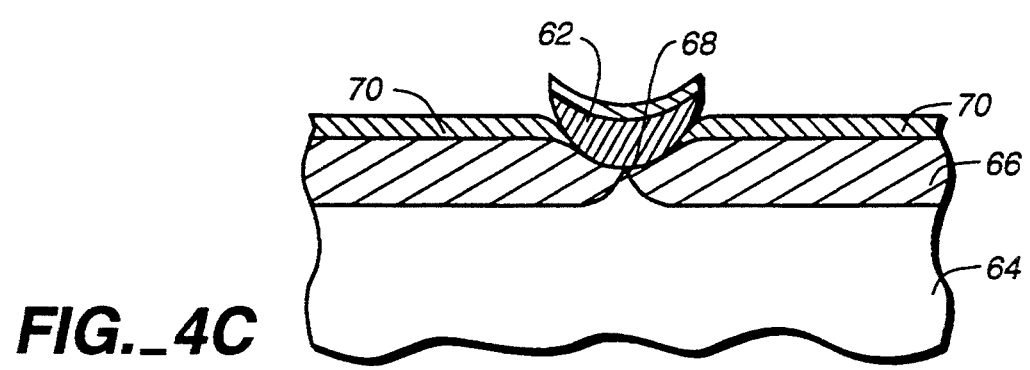
FIG._4C
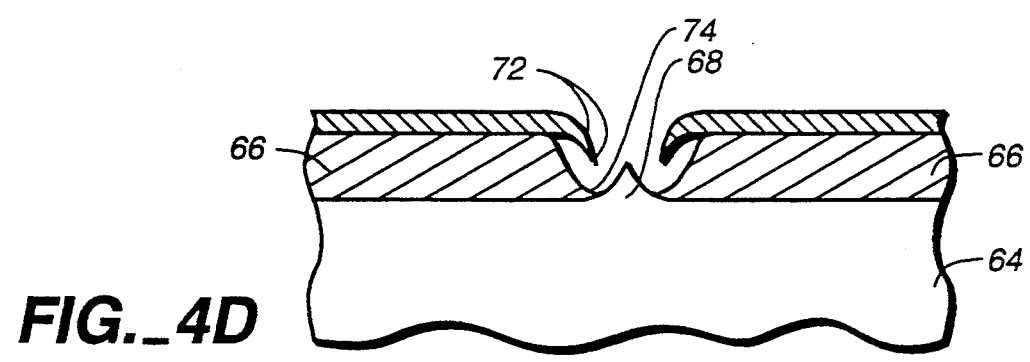
FIG._4D

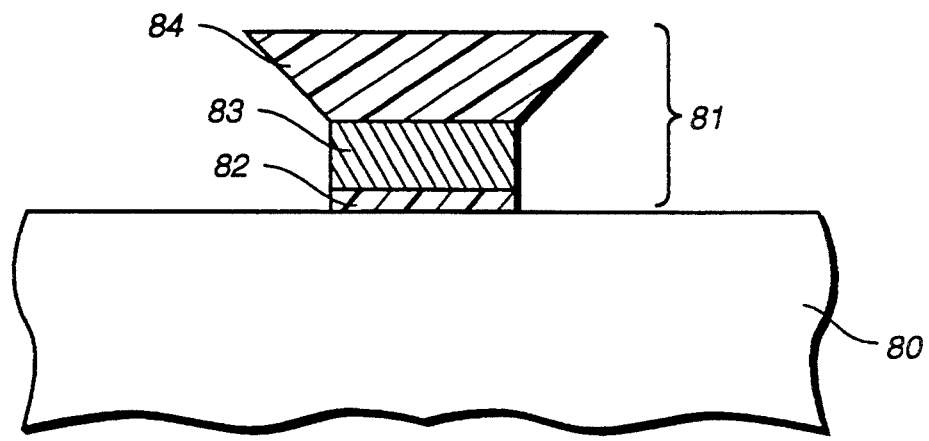
FIG._5A
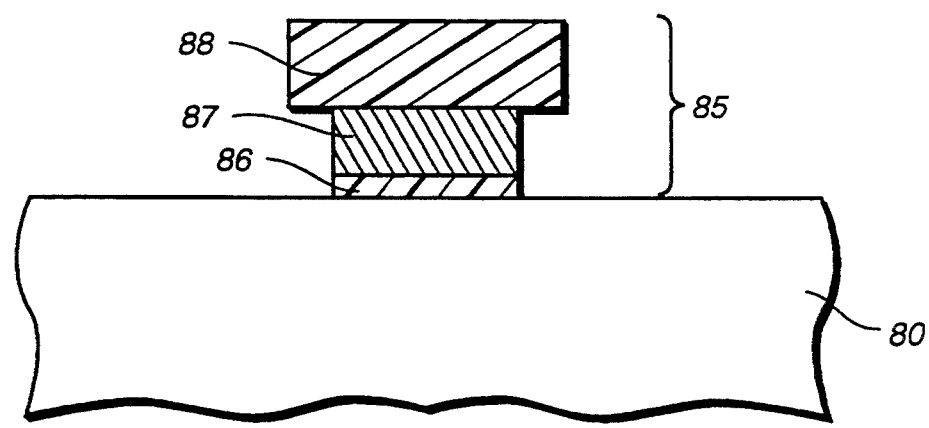
FIG._5B

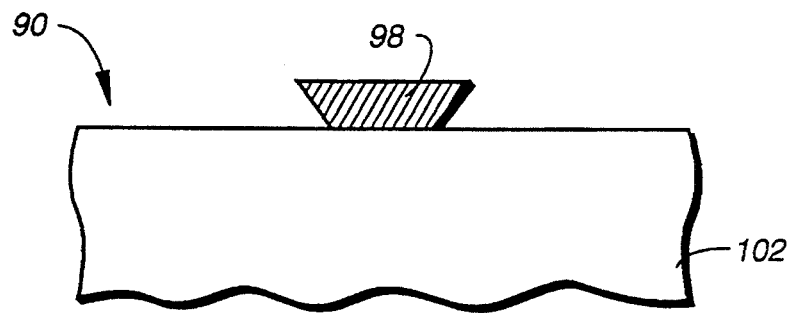
FIG._6A
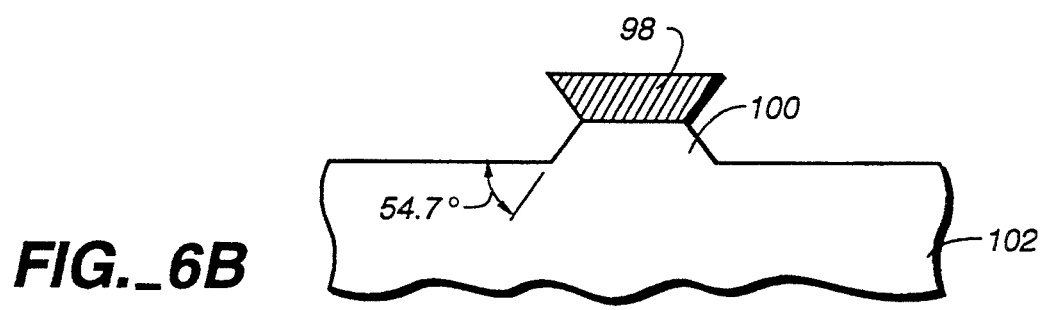
FIG._6B
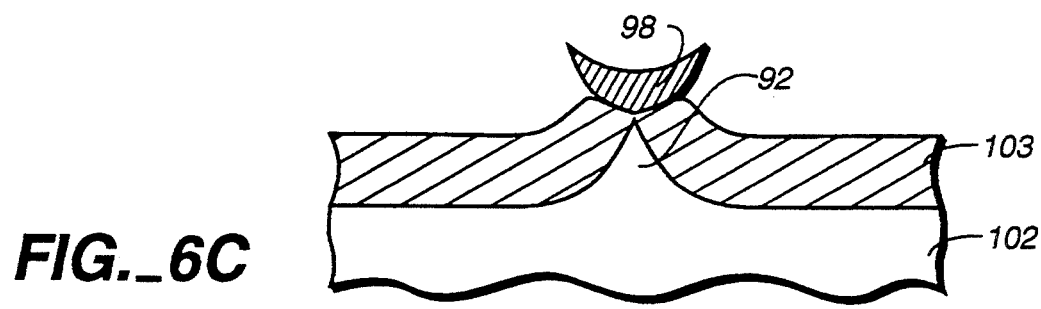
FIG._6C
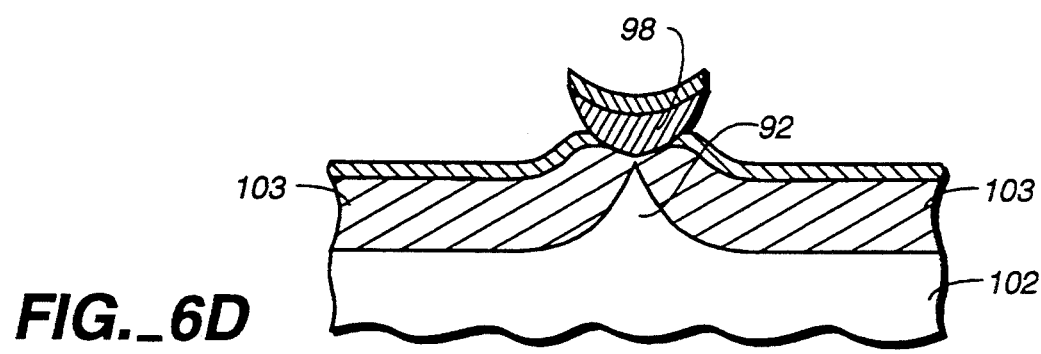
FIG._6D
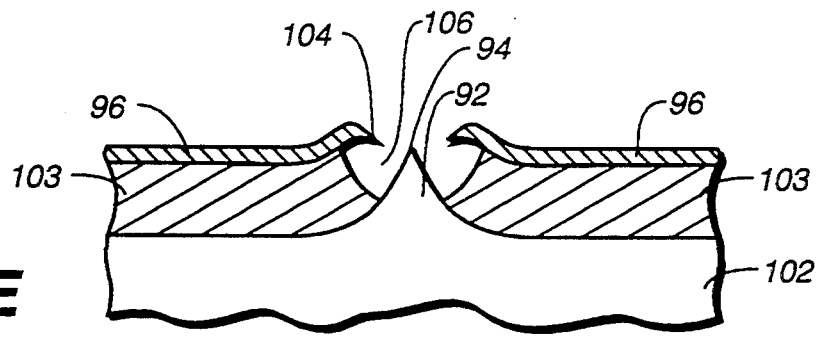
FIG._6E

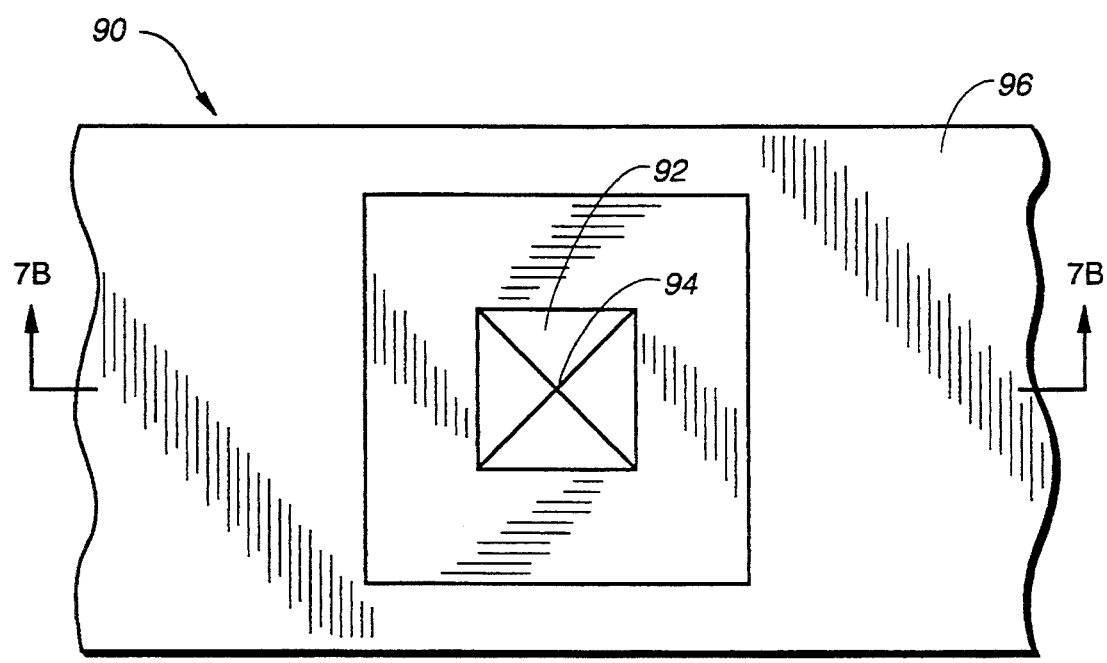
FIG._7A
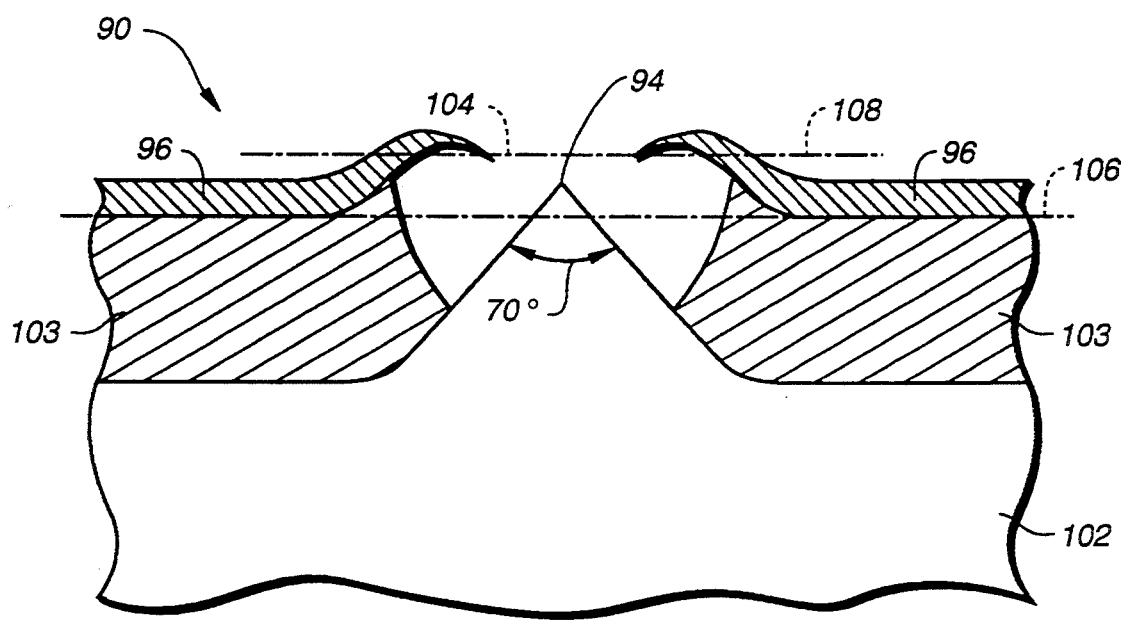
FIG._7B

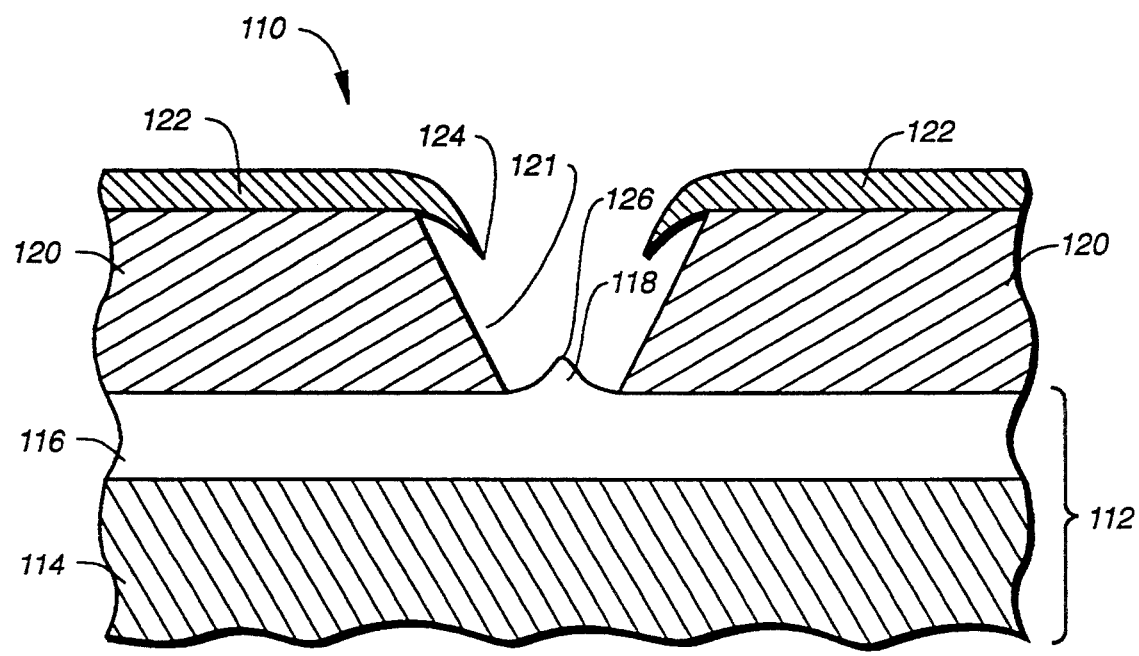
FIG._8
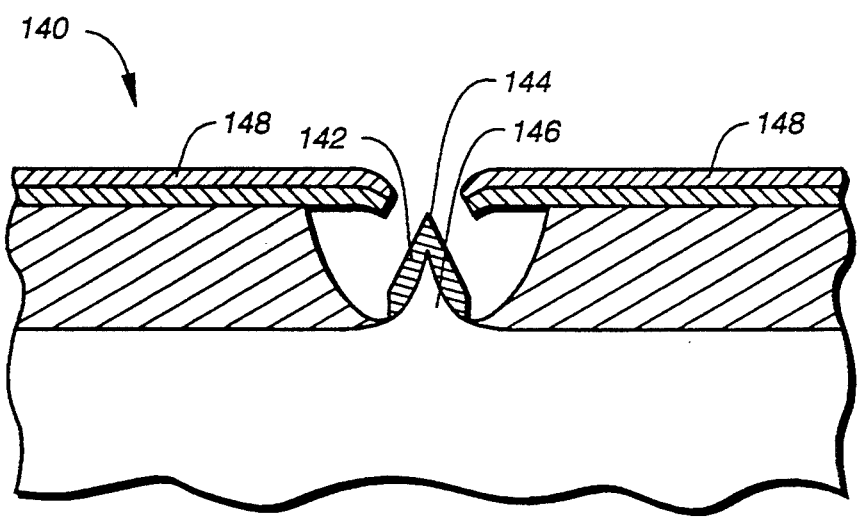
FIG._10

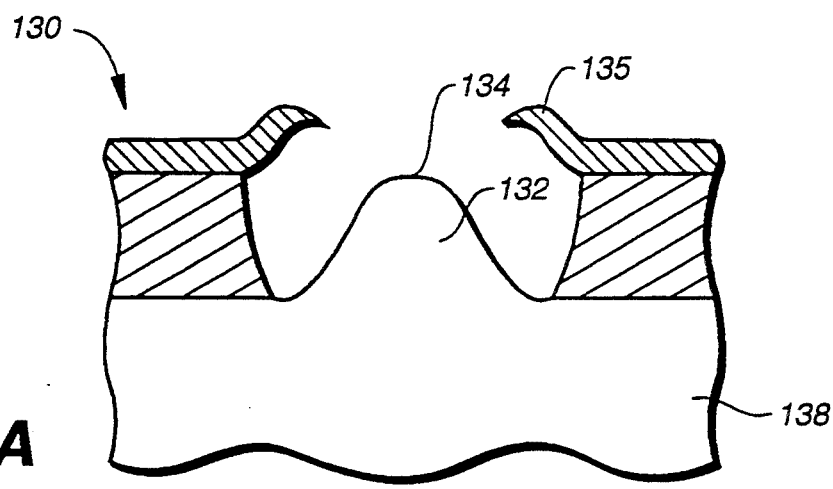
FIG._9A
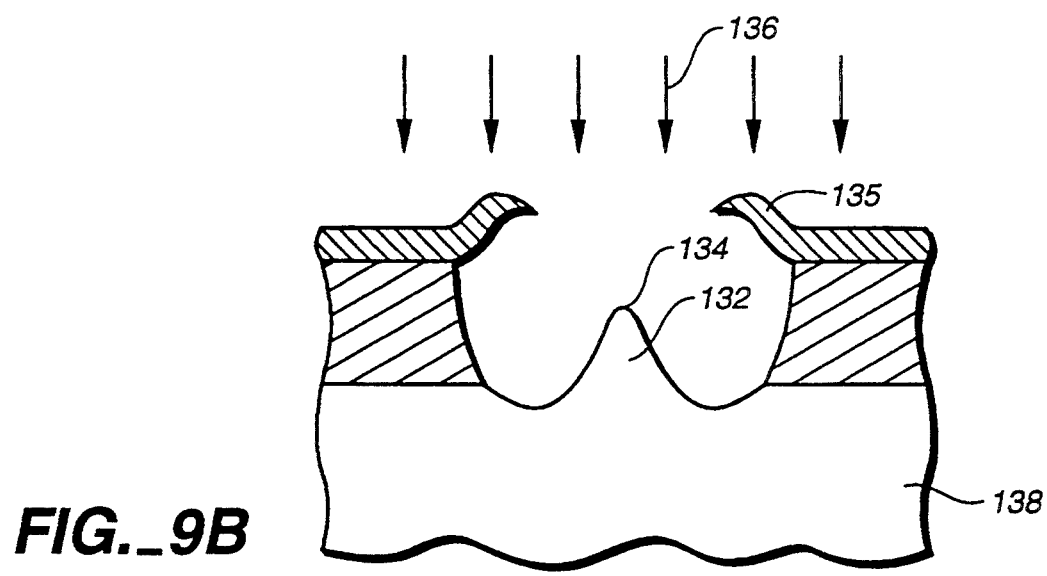
FIG._9B
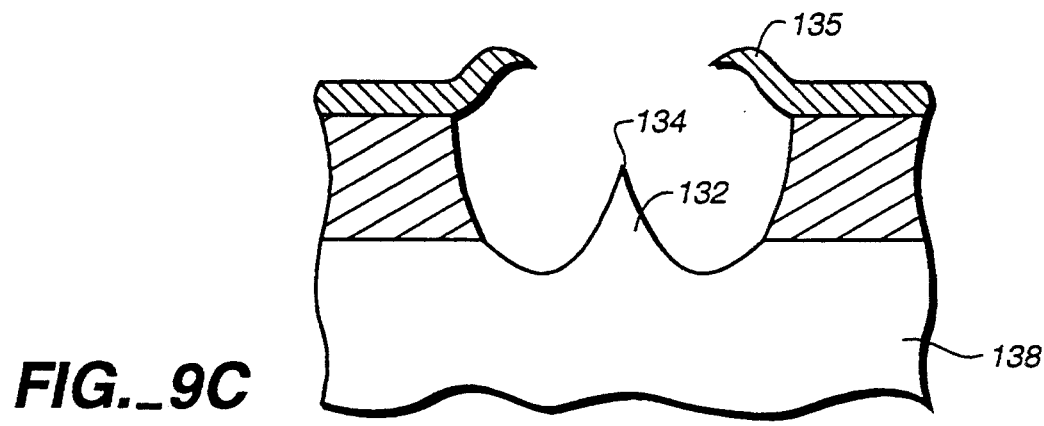
FIG._9C

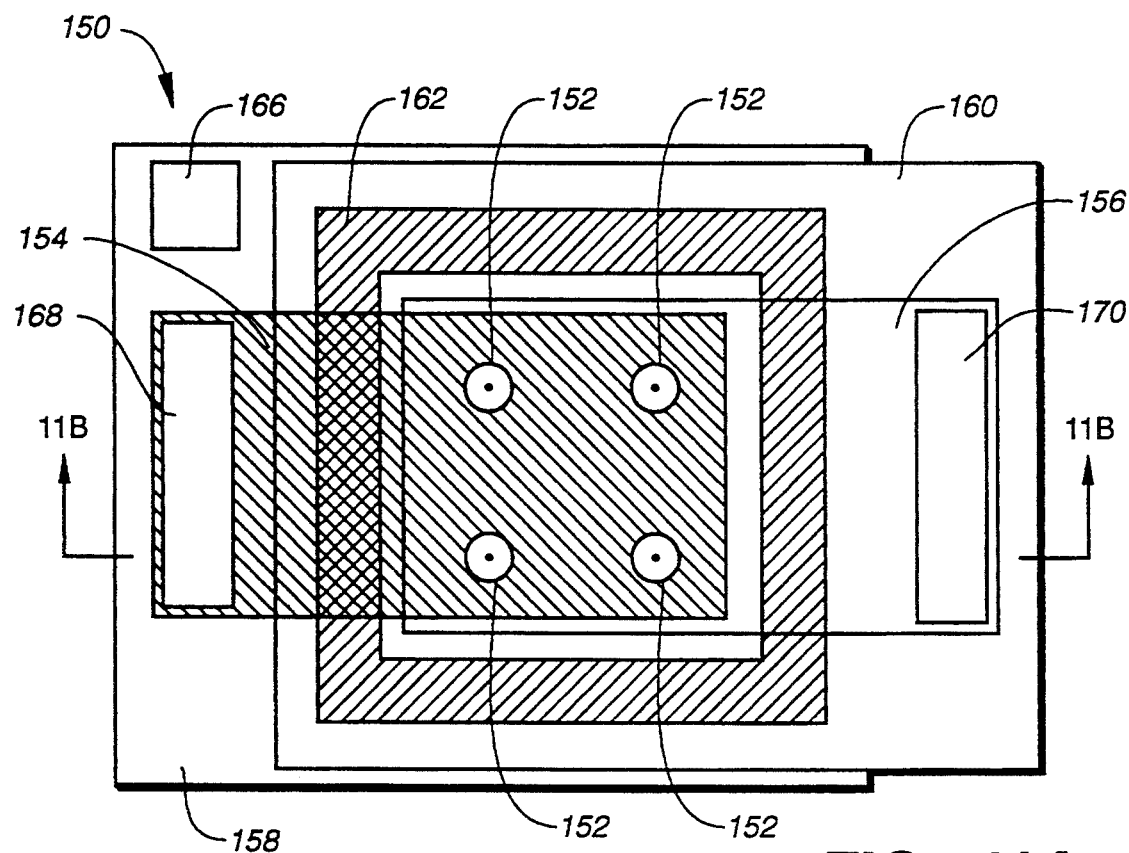
FIG._11A
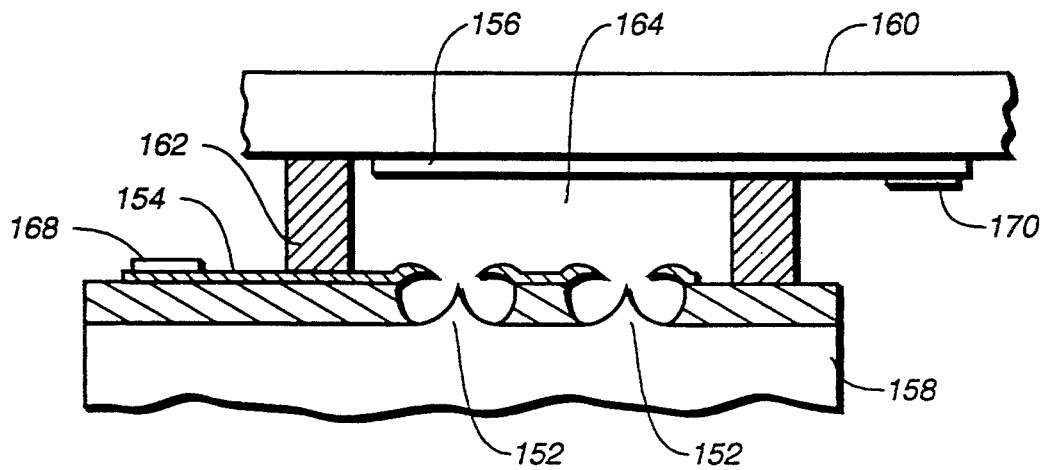
FIG._11B

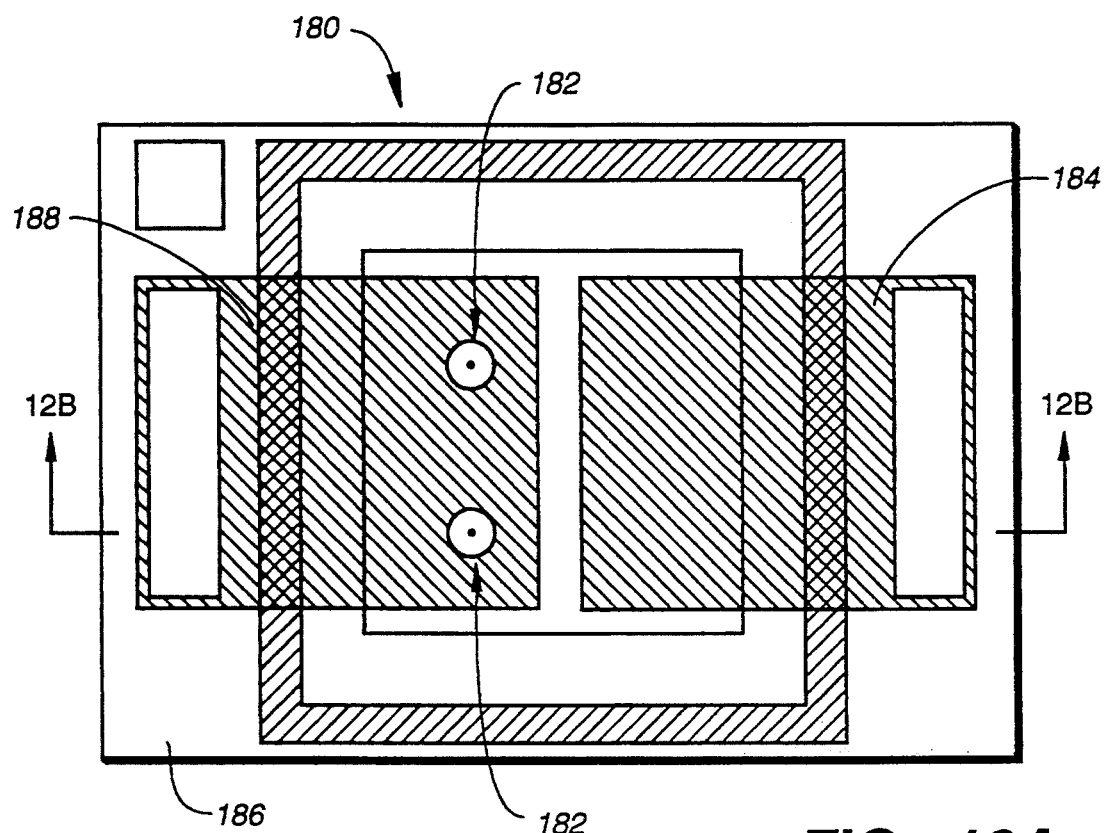
*FIG._12A*
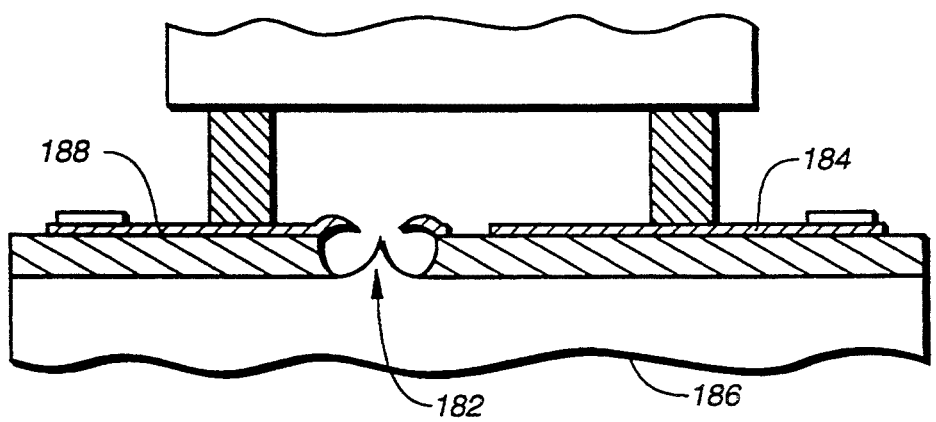
*FIG._12B*

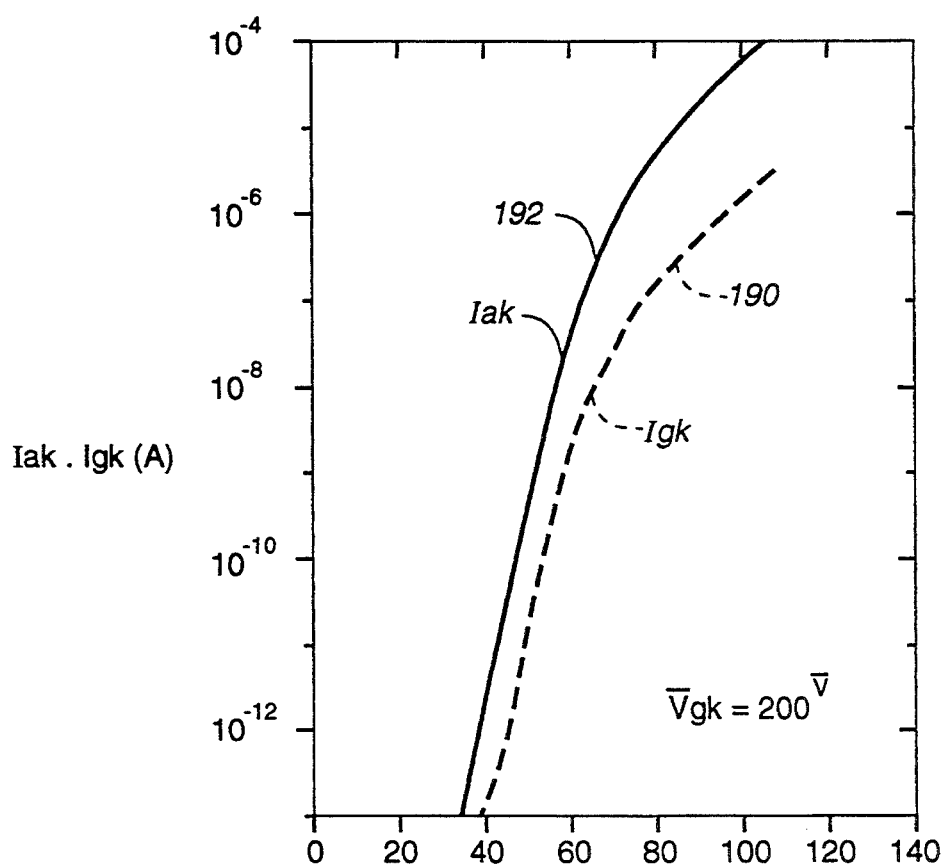
FIG._13
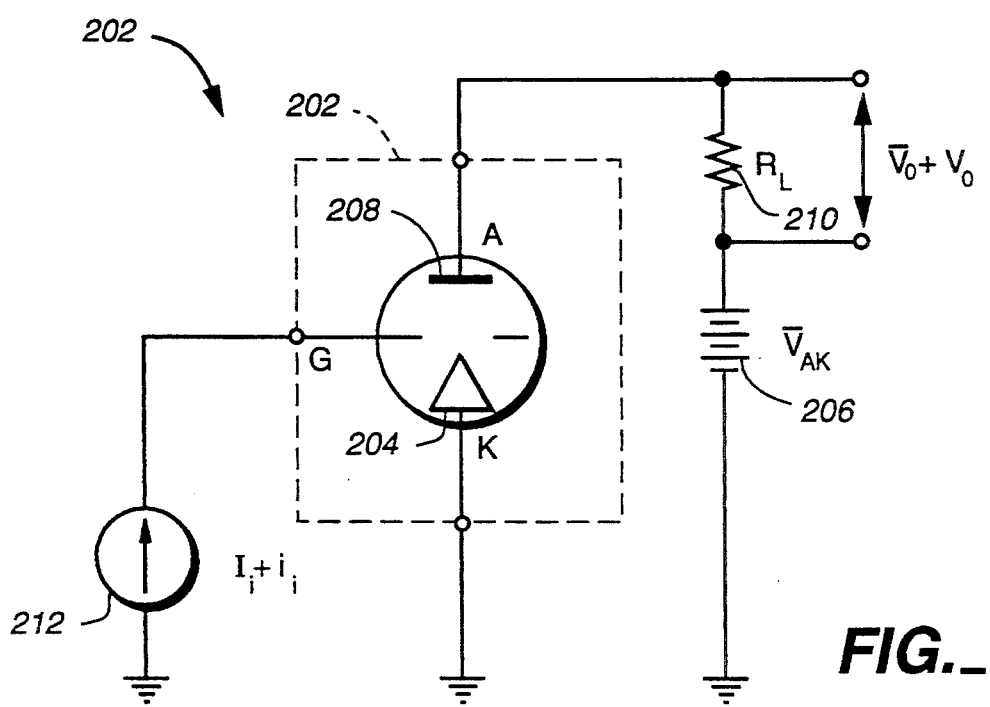
FIG._14

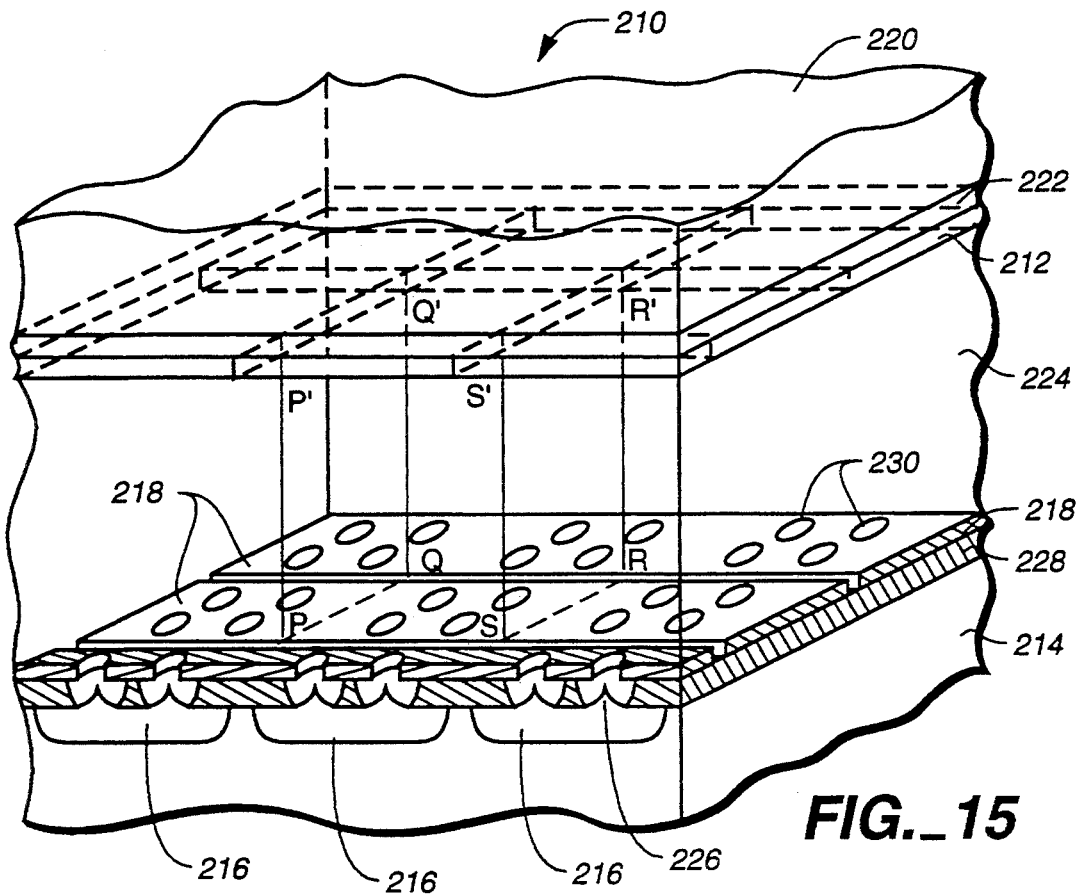
FIG._15
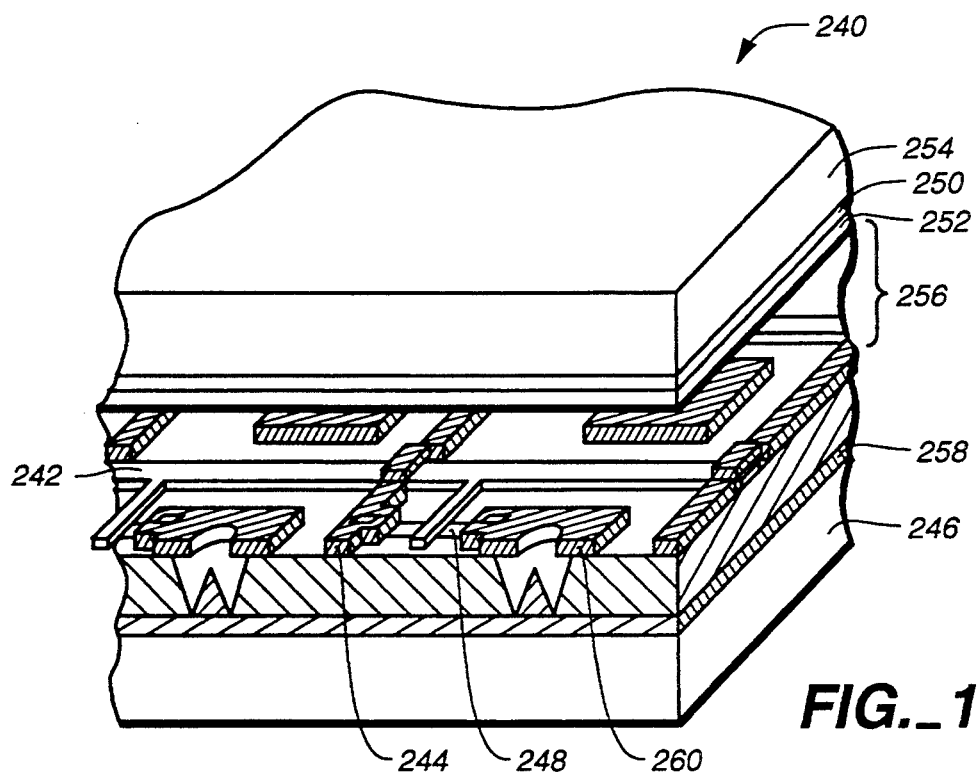
FIG._16

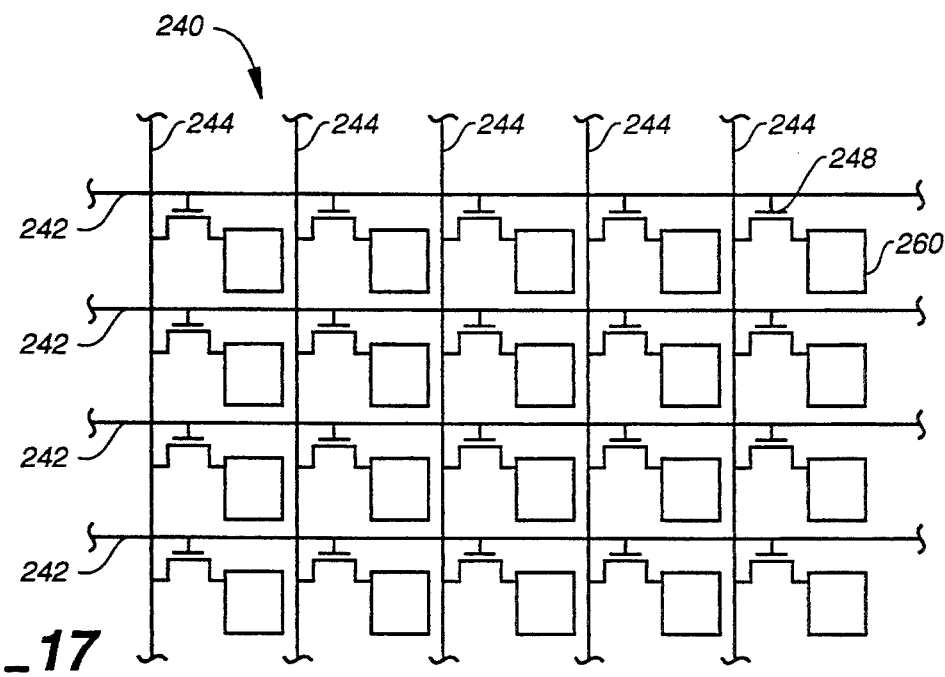
FIG._17
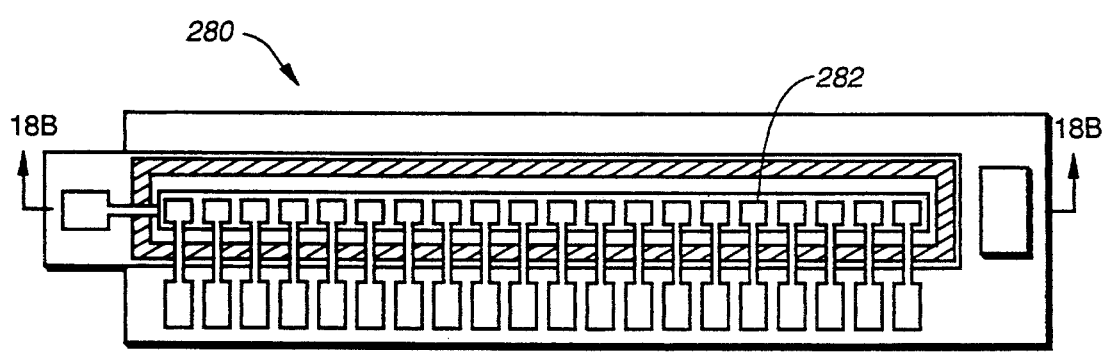
FIG._18A
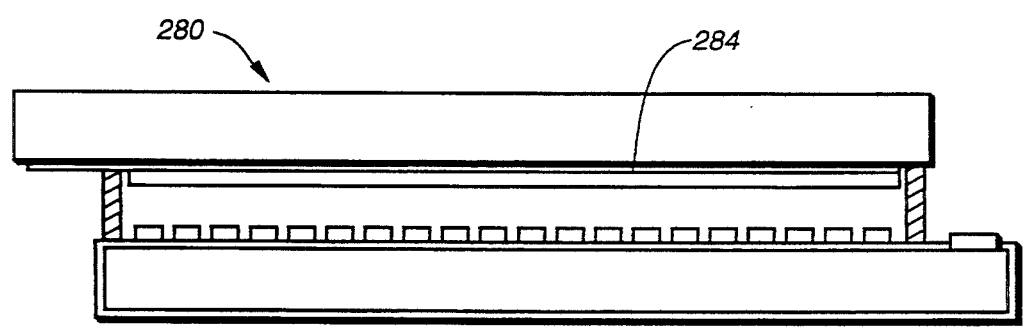
FIG._18B

ARRAY FIELD EMISSION DISPLAY DEVICE UTILIZING FIELD EMITTERS WITH DOWNWARDLY DESCENDING LIP PROJECTED GATE ELECTRODES

This application is a divisional application of pending application, Serial No. 08/073,149, filed Jun. 3, 1993 now U.S. Pat. No. 5,412,285, in the name of Hiroshi Komatsu and entitled, "LINEAR AMPLIFIER INCORPORATING A FIELD ELECTRON EMISSION DEVICE", which is a continuation of U.S. patent application Ser. No. 07/790,281, filed Nov. 7, 1991, now abandoned which is a continuation-in-part of U.S. patent application Ser. No. 07/624,424, filed Dec. 6, 1990, now abandoned.

BACKGROUND OF THE INVENTION

The present invention relates generally to thin-film field emission cathodes (TFFEC) and, specifically, to field electron emission devices (FEDs) used for luminous displays, optical print heads, multiple-electrode electronic devices, and x-ray sources.

DESCRIPTION OF THE PRIOR ART

Arrays of microscopic sized cones for use as field emission cathodes were developed by Spindt and his co-workers at SRI in about 1973. See the article of C. A. Spindt, et al., "Physical properties of thin-film field emission cathodes with molybdenum cones", Journal of Applied Physics, Vol. 47(12), pp. 5248–5263, December, 1976. Since then, silicon thin-film technology has advanced and allowed the cathodes to be made in arrays of up to 5000 cathodes at packing densities up to $6.4 \times 10^5/cm^2$. These cathodes offer very low operating voltages (100 V–300 V), compared to 1 KV to 30 KV for conventional etched wire emitters. The low-voltage operation is achieved by placing the accelerating electrode close to the cathode tip and making the radius of the cathode tip very small. The low voltage allows the cathodes to operate continuously with very stable emission properties and exhibit long life. TFFECs consist basically of a conductor/insulator/conductor sandwich. FIG. 1 is a cross-sectional drawing of a prior art Spindt-type field electron emission device 10, comprising an insulating layer 12 and a gate electrode 14 that are deposited on the surface of a low resistance silicon (Si) substrate 16. A cone-shaped cathode 18 is fabricated on the surface of the silicon substrate 16 within a first opening 20 in the insulating layer 12 and a second opening 22 in the gate electrode 14. The film thickness of the insulating layer 12 and the gate electrode 14 are 1.5 microns and 0.4 microns, respectively. The opening 22 in the gate electrode 14 has a diameter of 1.5 $\mu m$ and the height of the cathode 18 is about 1.9 $\mu m$.

Silicon dioxide ($SiO_2$) is deposited on the surface of substrate 16 to form insulating layer 12. Molybdenum (Mo) is used in a sputtering process to deposit gate electrode 14. A photo-etching process is then used on gate electrode 14 and insulating layer 12 to create gate electrode opening 22 and the insulating layer opening 20. The etching undercuts gate electrode 14 to form a wider opening 20. A molybdenum layer is then deposited by sputtering over the entire surface of device 10. As a consequence of the shadowing effect of openings 20 and 22 on the exposed surface of substrate 16, cathode 18 is naturally cone-shaped and is self-aligned within openings 20 and 22. The height of cathode 18 is a function of the sizes of openings 20 and 22 and the temperature used during sputtering. As the height of cathode 18 increases, the size of opening 22 decreases due to the build-up of molybdenum on the surface of gate electrode 14, thus narrowing the opening to the point of the cone. Eventually deposits to cathode 18 are pinched-off and the cone shape is complete. Next, the unnecessary molybdenum that forms on the surface of gate electrode 14 is removed by electrochemical etching, and that finishes the fabrication process. In this connection, see also, Spindt, et al., supra, at p. 5249.

Threshold voltages and current densities vary in prior art field electron emission devices because the distance between cathodes and their respective gate electrodes vary over large surface areas. The sputtering source will be perpendicular over a few cathode sites, but will be at some angle offset from 90° with respect to others, and those cathodes will be formed tilted and off to one side within the respective openings in the insulating layer and gate electrode. Since threshold voltage and current density are dependent upon the distance between the cathode and gate electrode, the emissions will not be uniform across the array. In forming the cathodes, the shape of each cathode is also difficult to control because etching of both the unnecessary molybdenum and the molybdenum forming the cathode occurs. This tends to reduce production yield.

An objective of the present invention is, therefore, to provide an array field emission display device having field emission devices of lower voltage operating characteristics with production processing that allows high-yield fabrication of cathodes on substrates having large surface areas.

SUMMARY OF THE INVENTION

According to a preferred embodiment, an array field emission display device field emission devices of the present invention comprises a substrate, field emitter having a cone-shaped cathode fabricated on the surface of the substrate, an insulating layer that is open around the cathode, a gate electrode deposited on the surface of the insulating layer such that the gate electrode is open at the cathode. More specifically, the field emission devices and method for their manufacturing comprise the use of a diffusion mask to preserve an area of a silicon substrate for use as a cathode while all around the cathode the substrate is being diffused with oxygen to form an insulating layer. The field emission devices further include a deposited molybdenum gate electrode layer on the insulating layer and etching the molybdenum gate electrode layer such that the diffusion mask falls off and the insulating layer is dissolved around the cathode through the hole formed in the gate electrode layer by removal of the diffusion mask. The gate electrode openings are, therefore, automatically and independently self-aligned with their respective cathodes.

The manufacturing process for the field electron emission device of the present invention comprises: (1) fabricating diffusion masks at the location of a cathode on the surface of a substrate, (2) diffusing insulating impurities into the surface of the substrate and fabricating the insulating layer and cathode, (3) fabricating a gate electrode layer on the surface of the insulating layer, (4) fabricating a gate electrode, which are automatically self-aligned relative to the cathode, which gate electrode is formed in the gate electrode layer and etching any openings in the gate electrode layer, and (5)

opening the insulating layer at the location of the cathodes.

Thus, an advantage of this invention is that each cathode cone is self-aligned within the gate opening and large arrays of cones can be fabricated with uniform cathode cone alignment.

A further advantage of this invention is that the cathode and gate electrode are separately fabricated but aligned automatically, as are the cathode cone projection shape and size so hat the resultant electrical characteristics of all of the electron emission devices are quite uniform.

A further advantage of this invention is that the several embodiments allow for flexibility in a large device manufacture because many different types of substrates can be employed, such as glass substrates, semiconductor substrates, and conductive substrates.

A further advantage of this invention is that the insulating layer is of high quality with superior electrical characteristics, such as, e.g., insulation strength. It also has high reliability, which is good for high voltage power devices that employ field electron emission devices.

A further advantage of this invention is that the production process suits semiconductor VLSI technology. Therefore, drive circuits and other circuits can be fabricated on the same substrate, rendering easier fabrication of compound and multifunctional devices, thus making this invention suitable in the fabrication of intelligent display devices.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

FIG. 1 is a cross-sectional drawing of a conventional Spindt-type field electron emission device known in the art.

FIGS. 2A and 2B illustrate a finished first embodiment of a field electron emission device of the present invention. FIG. 2A is a top elevational view and FIG. 2B is a cross-sectional view taken along line 2B—2B in FIG. 2A.

FIGS. 3A through 3E illustrate a first manufacturing process for producing the field electron emission device of FIG. 2, and are sequential cross-sectional views of the substrate after each major production step.

FIGS. 4A through 4D illustrate a second manufacturing process for producing the field electron emission device of FIG. 2 employing a reverse taper diffusion mask.

FIGS. 5A and 5B are cross-sectional views of two types of diffusion masks having multiple layers.

FIGS. 6A through 6E are cross-sectional views of a second embodiment of a device similar to the device of FIG. 2, after each major production step of the field electron emission device, in which increased cathode heights are obtained using a third manufacturing process.

FIG. 7A is a top elevational view of a third embodiment of a field electron emission device of the present invention. FIG. 7B is a cross-sectional view of the device taken along line 7B—7B of FIG. 7A.

FIG. 8 is a cross-sectional drawing of a fourth embodiment of a field electron emission device having an insulating substrate.

FIGS. 9A through 9C are cross-sectional drawings of a fifth embodiment of a field electron emission device beginning after step six of a third manufacturing process.

FIG. 10 is a cross-sectional drawing of an embodiment of a field electron emission device of the present invention having a barium thin-film layer coating over the tip of the cathode.

FIG. 11A is a top elevational view of a vertical three-electrode device and FIG. 11B is a cross-sectional view of the device taken along line 11B—11B of FIG. 11A according to a sixth embodiment of this invention.

FIG. 12A is a top elevational view of a horizontal three-electrode device and FIG. 12B is a cross-sectional view of the device taken along line 12B—12B of FIG. 12A.

FIG. 13 is a current (A) versus voltage (V) graph showing the static characteristics of the vertical three-electrode device.

FIG. 14 is a schematic of a linear amplifier that incorporates the vertical three-electrode device as a cathode in a tube.

FIG. 15 is a three-dimensional view of a segment of a simple matrix luminous display device comprising a seventh embodiment of this invention. On the bottom is an array of field electron emission devices and on the top is a luminous panel that lights up when struck by the emitted electrons.

FIG. 16 is a partial isometric drawing of an active matrix luminous display device.

FIG. 17 is a schematic circuit diagram of the display device of FIG. 16.

FIG. 18A is an elevational view of a monochrome optical print head and FIG. 18B is a cross-section of the print head taken along line 18B—18B of FIG. 18A according to an eighth embodiment of this invention.

DESCRIPTION OF THE PREFERRED EMBODIMENTS

First Embodiment

FIG. 2A illustrates a first embodiment of a field electron emission device 30 of the present invention. Device 30 comprises a flat single crystal silicon substrate 32, a cone-shaped cathode 34 fabricated on the surface of substrate 32, an insulating layer 36 that is opened at the location of cathode 34 and fabricated on the surface of substrate 32, and a gate electrode 38 that is open at the location of cathode 34 and is fabricated on the surface of insulating layer 36. Substrate 32 is a single crystal silicon substrate with an n-type conductor and a surface carrier concentration of $1 \times 10^{19}$ cm $^{-3}$. Cathode 34 is fabricated of the same n-type single crystal silicon as the substrate and is a single integral part of substrate 32. Cathode 34 has a height of approximately 2400 angstroms (Å) and is generally cone-shaped. A projecting tip 40 of cathode 34 rises from substrate 32 in a cone having a radius of curvature of approximately 1000 Å or less. Insulating layer 36 comprises a silicon dioxide material that is fabricated by thermal oxidation of substrate 32. The film thickness of insulating layer 36 is approximately 5000 Å, resulting in an electrical resistance level of about 8 MV per centimeter. Gate electrode 38 is a molybdenum thin-film having a thickness of approximately 1000 Å. Cathode 34 has a centerline 42 and is aligned with a concentric opening 44 in gate electrode 38. Gate electrode opening 44 has an inside diameter of about 4000 Å. Gate electrode 38 is constructed so that it overhangs insulating layer 36 and droops in toward cathode 34. An opening 46 helps to more fully expose cathode 34. The droop of gate electrode 38 into opening 46 shifts the effective plane of gate electrode opening 44 from a plane 48 to a plane 49, which is closer to substrate 32. The shortest distance between projecting tip 40 and gate electrode 38 is preferably about 2700 Å.

FIGS. 3A through 3E illustrate a first production process sequence employed to fabricate device 30. Substrate 32 is preferably a part of a six inch diameter wafer of an n-type single crystal of silicon that is 700 microns thick. Beginning with FIG. 3A, a diffusion mask 50 of silicon nitride ($Si_3N_4$) film is then left over the desired location of cathode 34 on substrate 32 after etching. The silicon nitride ($Si_3N_4$) film is deposited using thermal CVD (chemical vapor deposition) to a thickness of about 3000 Å. Photo-etching diffusion mask 50 results in a truncated cone shape with a diameter of about 5000 Å. Diffusion mask 50 has normally tapered walls that are perpendicular to substrate 32. Alternatively, diffusion mask 50 is shaped like a truncated pyramid or a truncated elliptical cone.

In FIG. 3B, thermal oxidation is used to diffuse oxygen, which is an insulating impurity, into regions on the substrate not covered by diffusion mask 50. Mask 50 inhibits the formation of silicon dioxide directly underneath it. The edges of diffusion mask 50 are pushed up by the formation of the silicon dioxide layer 36 and that causes mask 50 to deform into a concave shape. Since oxygen must diffuse around the edges of mask 50, this forms a cone shaped volume of substrate 32 that rises or projects upward within the plane of insulating layer 36. This silicon protrusion is, of course, cathode 34. Preferably, substrate 32 is heated to 1100° C. with vapor oxidation lasting 30 minutes. This will result in a silicon dioxide insulating layer 36 that is 5000 Å thick. Cathode 34 preferably has a base diameter of approximately 5000 Å. In FIG. 3C, a molybdenum gate electrode layer 52, about 2000 Å thick, is fabricated on the surface of insulating layer 36 employing sputtering techniques. Layer 52 also has a thickness of about 800 Å on the side walls of diffusion mask 50.

In FIG. 3D, 1000 Å of material is removed from the walls of the diffusion mask 50 by dry etching, thus removing the molybdenum. This leaves about 1000 Å of gate electrode 52 on the surface of the diffusion mask 50 and insulating layer 36. The exposed walls of diffusion mask 50 are then etched with a thermal phosphoric acid solution. Diffusion mask 50 is then lifted off and removed exposing an opening 44 that is automatically aligned with cathode 34. The diameter of gate electrode opening 44 is about 4000 Å.

Finally, in FIG. 3E, opening 46 is made by removing portions of insulating layer 36, thus exposing cathode 34. Preferably, a hydrofluoric acid (HF) buffer solution (HF+NH) is used to dissolve the silicon dioxide in insulating layer 36 because such a solution will not dissolve molybdenum nor silicon. A field electron emission device produced by the above production process will have a minimum distance between cathode 34 and gate electrode 38 of about 2700 Å. The variation in this dimension across devices in a six-inch wafer is very small, and is generally within plus or minus 2%. Any variation that does result depends on the horizontal oxidation rate of the silicon substrate of the lower surface of diffusion mask 50. Variations in cathode 34 to gate electrode 38 spacing can be reduced by making the temperature of the substrate 32 uniform during thermal oxidation.

Device 30, produced in the above manner, has a cathode current $I_k$ equal to one microamp, and a threshold voltage $V_{th}$ equal to 80 V, when measured in a high-level vacuum ($1 \times 10^{-7}$ or less). The variation of $I_k$ is within ±5%. The variation of the threshold voltage $V_{th}$ depends on the particular surface conditions of each cathode 34. Improvements in uniformity can be realized by cleaning the surfaces of cathode 34 in a vacuum. The threshold voltage $V_{th}$ may be reduced by shortening the distance between cathode 34 and gate electrode 38. To accomplish this, the thickness of insulating layer 36 is decreased, or the diameters of diffusion mask 50 and gate electrode opening 44 are reduced by etching away the SiON film that has been fabricated on the surface of the mask before fabricating gate electrode 38. The use of silicon dioxide, above, is merely exemplary, alternatively, materials such as silicon nitrides ($SiN_x$) or silicon-oxygen-nitride (SION), in which nitrogen and oxygen is diffused, can also be used. The use of thermal oxidation as used above to form the insulating layer is also merely exemplary. The diffusion of insulating impurities by means of ion-implantation and anodic oxidation are also suitable. Silicon dioxide is used in the exemplary embodiment above for the insulating layer. However, the present invention is not limited to this material. A p-n junction depletion layer may be fabricated between a p-type silicon substrate 32 and an n-type silicon layer. In this case, cathode 34 would be p-type silicon and insulating layer 36 would contain phosphorous as an insulating impurity. When the impurity concentration of a p-type single crystal silicon is about $1 \times 10^{15}$ cm$^{-3}$, the breakdown voltage of any p-n junction depletion layer will generally be about 300 volts. This is a sufficiently high enough voltage breakdown to support its use as insulating layer 36. An n-type silicon layer fabricated on the surface may also be used as the gate electrode. The insulating layer may also be of stacked construction employing a silicon dioxide layer. Besides using molybdenum for gate electrode 38, metals such as titanium (Ti), chromium (Cr), aluminum (Al), tantalum (Ta), and silicides of other semiconductor materials may also be employed. Substrate 32 was described above as being an n-type single crystal silicon. Other semiconductor substrates, such as, p-type single crystal silicon, germanium, gallium arsenide, and metal substrates, such as, aluminum may also be employed.

Second Embodiment

A field electron emission device 60 is similar to device 30 but is fabricated with a reverse taper shape diffusion mask 62, as shown in FIGS. 4A through 4D. In FIG. 4A, reverse taper diffusion mask 62 is fabricated on the surface of a substrate 64. The diffusion mask 62 is made by thermal CVD deposition of a silicon dioxide layer, 5000 Å thick, on the surface of substrate 64, and, using thermal CVD and photo-etching to achieve a reverse taper shape. Preferably an HF-type wet etch is used where there is a strong adhesiveness with the resist that causes etching at the interface with substrate 64 to progress rapidly. Mask 62 has a reverse truncated cone shape that is 0.5 microns in diameter where it comes into contact with substrate 64 and is 1.5 microns in diameter on the opposite side.

In FIG. 4B, thermal oxidation is used to diffuse oxygen, which is an insulating impurity, into regions on the substrate not covered by diffusion mask 62. Mask 62 inhibits the formation of silicon dioxide directly underneath it. The edges of diffusion mask 62 are pushed up by the formation of the silicon dioxide layer 66 and the resultant swelling that causes mask 62 to deform into a concave shape. Since oxygen must diffuse around the edges of mask 62, this will form a cone shaped volume of substrate 32 that seems to rise within the plane of insulating layer 66. This silicon protrusion forms a cathode 68. Preferably, substrate 64 is heated to 1100° C. with vapor oxidation lasting 30 minutes. This will result in a silicon dioxide insulating layer 66 that is 5000 Å thick. Cathode 68 preferably has a base diameter of approximately 5000 Å.

In FIG. 4C, a gate electrode layer 70 is fabricated using a directional particulate deposition process that accelerates particles in a generally perpendicular direction to the surface of substrate 64 to deposit the gate electrode 70. When this kind of process is used, material is not deposited on the vertical walls of diffusion mask 62 due to the shadowing effect of the overhanging edges of diffusion mask 62. What material is deposited near mask 62 on layer 66 tapers to a point as gate electrode 70 grows close to cathode 68. Preferably, electron beam vapor deposition is used for the above directional particulate deposition process. Molybdenum particles are deposited at a film thickness of 1000 Å to form gate electrode 70. As alternatives to the use of an electron beam vapor deposition process, sputtering and ECR plasma deposition may also be employed with good results.

In FIG. 4D, a gate electrode opening 72 and an insulating layer opening 74 are fabricated consecutively. Openings 72 and 74 automatically align with cathode 68. Under diffusion mask 62 and around cathode 68, insulating layer 66 is etched away by an HF buffer solution. The molybdenum on the surface of diffusion mask 62 lifts away from its attachment to substrate 64. The production step in the first embodiment in which the molybdenum vertical side walls are removed to expose the diffusion mask is not necessary in this embodiment. Since diffusion mask 62 and insulating layer 66 are composed of the same material, a single process can be used to consecutively form the gate electrode opening 72 and insulating layer opening 74. Although a single layer reverse taper shape diffusion mask fabricated of silicon dioxide was used as diffusion mask 62, in the exemplary embodiment above, an overhanging roof shaped diffusion mask made up of several layers can also be used.

FIGS. 5A and 5B illustrate two types of diffusion masks made up of more than one layer. In FIG. 5A, beginning at a substrate 80, a diffusion mask 81 comprises a first layer of silicon dioxide film 82, a Si3N4 layer 83, and a second silicon dioxide layer 84. In FIG. 5B, beginning at a substrate 80, a diffusion mask 85 comprises a first layer of silicon dioxide film 86, a Si3N4 layer 87 and a second silicon dioxide layer 88. Second silicon dioxide layer 84 has a reverse taper shape, while the second layer of dioxide film 88 has a normal taper shape. Both project out past first silicon dioxide layers 82 and 86, respectively, and beyond Si3N4 layers 83 and 87. The overhanging feature of layers 84 and 88 are important for good gate electrode formation. Si3N4 layers 83 and 87 tend to prevent insulating impurities from migrating. First silicon dioxide layers 82 and 86 have a beneficial stress relieving effect.

A field electron emission device 90 having a cathode 92, that is taller than that described above, and that has a projecting tip 94 closer to a gate electrode 96 is illustrated in FIGS. 6A through 6E. In FIG. 6A, a diffusion mask 98 is fabricated at the desired location of cathode 92. In FIG. 6B, a pedestal 100 is fabricated beneath substrate diffusion mask 98. The plane of diffusion mask 98 has a square shape and the cross section is a reverse taper, forming a reverse angle truncated cone shape. The edge of mask 98 that contacts a substrate 102 is preferably in the shape of a square, 5000 Å per side. See discussion below relative to FIGS. 7A and 7B. The orientation of at least one of the sides matches the <110>-orientation of a single crystal of silicon forming substrate 102. The production process for diffusion mask 98 is the same as that for the second embodiment above. Pedestal 100 is a truncated cone that has a base height of 3500 Å and a top surface with 5000 Å sides. Diffusion mask 98 is fabricated by anisotropic etching of single crystal silicon substrate 102 using diffusion mask 50 as the etching mask. An ethylene-diamine-pyrocatecal and water (EPW) process is used in an anisotropic etching process which uses an etching compound of EPW. Alternatively, a potassium hydroxide (KOH) process and a dry etching process could also be used. Pedestal 100 has four walls with surfaces that form a 54.7° angle relative to the surface of <111>-oriented substrate 102. Production steps 2 to 5, are the same as the production steps used in the second embodiment, above.

Third Embodiment

FIG. 7A is a top elevational view of field electron emission device 90, and FIG. 7B is a cross-sectional drawing taken along line 7B—7B of FIG. 7A. Cathode 92 is fabricated on the surface of substrate 102 and has a height of 6000 Å. The apex angle of a cross section of cathode 92 is a true quadrangular pyramid of about 70°. Cathode 92 has a perpendicular axis that passes through the center of a square-shaped gate electrode opening 104. The thickness of insulating layer 103 away from cathode 92 is about 5000 Å. The thickness of gate electrode 96 is about 1000 Å. As a result, projecting tip 94 is higher than a virtual plane 106, and lower than a virtual plane 108. The shortest distance between projecting tip 94 and gate electrode 96 is about 2500 Å. Compared to the first or second embodiments, above, field electron emission device 90 has its projecting tip 94 closer to its gate electrode 96. Using pedestal 100 results in a reduction in the volume of silicon dioxide film that swells at the location of projecting tip 94. The threshold voltage of field electron emission device 90 is $V_{th}=70$ V.

Fourth Embodiment

In FIG. 8, a field electron emission device 110 has a substrate 112 comprises an insulating substrate 114 made from transparent quartz and a conductive thin-film 116 of conductive n-type polycrystalline silicon thin-film that is fabricated on the surface of insulating substrate 114. A cathode 118 is fabricated on the surface of silicon thin-film 116 as one unit and consists of the same material. An insulating layer 120 is fabricated on the surface of silicon thin-film layer 116, and comprises a silicon dioxide film that has an opening 121 surrounding cathode 118. Device 110 further comprises a gate electrode 122, which is fabricated on the surface of insulating layer 120 and has an opening 124 above cathode 118. Silicon thin-film layer 116 has an electron concentration of about $1 \times 10^{18}$ cm$^{-3}$ and a resistivity of about 0.03 ohm centimeters. Its film thickness is about 5000 Å in the planar regions in which cathode 118 does not exist. Cathode 118 is generally cone-shaped with a height of about 2000 Å. The curvature radius of projecting tip 126 is 2000 Å or less. The film thickness of insulating layer 120 is about 5500 Å, and is fabricated by thermally diffusing oxygen onto silicon thin-film layer 116. Gate electrode 122 comprises a molybdenum thin-film that is 1000 Å thick. Gate electrode opening 124 is circular in shape with a diameter of 5500 Å. Gate electrode opening 124 automatically aligns with cathode 118. Except for the preparation step and the thermal oxidation condition of substrate 112, the production process of field electron emission device 110 is the same as that process described for the second embodiment above. In the preparation step, the n-type silicon thin-film 116 is fabricated on the surface of quartz substrate 114 which is 1.1 millimeters thick and on a wafer preferably six inches in diameter. Silicon thin-film 116 is a non-doped polycrystalline silicon thin-film that is 8000 Å thick and has had its resistance lowered by a thermal diffusion of phosphorous (P) deposited by means of low-pressure CVD. The thermal oxidation for layer 120 preferably occurs when the substrate 112 temperature is 1100° C. and has a 20 minute vapor oxidation duration. (The oxidation rate of polycrystalline silicon is much shorter, compared to a single crystal silicon thin-film, and makes the oxidation time shorter.) Silicon thin-film can also be used for interconnects. In such a case, if the silicon thin-film is etched and separated before the thermal oxidation step, the interconnects will also be covered by the insulating layer, making for convenient insulation separation of the interconnects. If a transparent material is used for the insulating substrate, the regions on the substrate in which components, such as, silicon thin-film 116 and gate electrode 122 do not exist will be transparent. As a result, if field electron emission device 110 is used to create a luminous display device, a brilliant display can be realized because the light emitted from the luminous layer can be seen from the direction of substrate 112. Device 110 is an exemplary embodiment having a conductive silicon thin-film and a silicon dioxide layer that is used as an insulating layer. Other combinations of the materials in Table I, for example, can also be applied.

TABLE I

| Conductive Thin Films 116 | Insulating Layers 114 |
| --- | --- |
| Single crystal silicon (c-Si) | $SiO_2$ or $Si_3N_4$ |
| Polycrystalline silicon (p-Si) | $SiO_2$ or $Si_3N_4$ |
| Amorphous silicon (a-Si) | $SiO_2$ or $Si_3N_4$ |
| Aluminum (Al) | $Al_2O_3$ |
| Tantalum (Ta) | $Ta_2O_5$ |

Here, $Al_2O_3$ and $Ta_2O_5$ may also be fabricated by diffusing oxygen, an insulating impurity, into aluminum or tantalum by means of anodic oxidation. Besides quartz substrate 114, any substrate that will withstand the production process can be used, regardless of its type. Projecting tip 126 can be moved closer to gate electrode 122 by applying the production process of the third embodiment (the one that uses a pedestal 100) to device 110.

Fifth Embodiment

A field electron emission device 130 has a cathode 132 that is sharpened and made more pointed by a process illustrated in FIGS. 9A, 9B and 9C. This process can be applied to the field electron emission devices 30, 60, 90, and 110, as well as most other field electron emission devices that have a cone shaped cathode. Cathode 132 is sharpened by dry etching after having gone through the first few production steps described above. Some cathodes 132 will have a large curvature radius of 1000 Å, or more, due to the diffusion of impurities along the interface. Field electron emission device 130 will have a very large threshold voltage and other poor electrical properties if cathode 132 is left rounded. In order to give a projecting tip 134 a smaller radius curvature and to improve the electrical properties, a beam-shaped etching gas 136 is used on cathode 132. When cathode 132 is made of a silicon material, carbon tetrafluoride ($CF_4$) in a plasma form is used as etching gas 136 to chemically etch away the material on the sides of cathode 132. Alternatively, physical etching, in which accelerated particles are sputtered, is also effective against more materials than just silicon. This process results in a substrate 138 that has been gouged out around the periphery of cathode 132 and that puts projecting tip 134 one and a half times farther away from a gate electrode 140. The curvature radius of cathode 132 can approach 500 Å or less, creating sharp cathode 132 in FIG. 9C. Field electron emission devices having cathodes sharpened by the present invention typically demonstrate a threshold voltage of $V_{th}55$ V. The threshold voltage of device 130 in FIG. 9C is improved by being decreased by about 30 percent compared to that of device 130 in FIG. 9A.

FIG. 10 illustrates a field electron emission device 140 in which a thin-film layer of barium 142 was fabricated on a tip 144 of a cathode 146. Thin-films, such as barium (Ba), cesium (Cs), thorium (Th), barium oxide (BaO) and thorium dioxide ($ThO_2$), on the projecting tip 144 reduce the work function of cathode 146 and also reduce the threshold voltage. Other ways to reduce the threshold voltage are to decrease the distance between the gate electrode and the cathode, and to reduce the radius of projecting tip 144. The threshold voltage of field electron emission device 140 is approximately $V_{th}=40$ V. Any thin-film layer 142 also decreases the mechanical distance between cathode 146 and a gate electrode 148, and this, of course, has the effect of reducing the threshold voltage.

Sixth Embodiment

FIGS. 11A and 11B illustrate a vertical three-electrode device 150 comprising a vacuum transistor having a plurality of cathodes 152, a gate electrode 154, and an anode 156 (all of which are intended to operate in a vacuum). Device 150 controls electron current by adjusting the electrical potential of each electrode 152, 154, and 156. A substrate 158 has fabricated within it cathodes 152 and gate electrode 154. Opposing substrate 160 has anode 156 on its surface such that cathodes 152 and anode 156 face one another. Placing device 150 in a vacuum of $1 \times 10^{-7}$ Torr will allow electrons to escape the cathodes 152 and to be accelerated/collected by anode 156, which is made of tungsten. The field electron emission devices on substrate 158 are preferably fabricated as described above for the third embodiment. The four field electron emission devices are placed in an array and share gate electrode 154, which is common to all. The opposing substrate 160 is a flat piece of glass with a thermal coefficient of expansion that matches substrate 158 to within 10%. A supporting structure 162 is made of the same type of glass as opposing substrate 160 and surrounds the field electron emission devices. A vacuum 164 is maintained within structure 162 and between substrates 158 and 160 at better than $1 \times 10^{-7}$ Torr by means of a BaAl$_4$ gettering material that is evaporated by optical heating. A cathode pin 166, a gate pin 168, and an anode pin 170, are used for external electrical connections. Vertical three-electrode device 150 has an average distance between cathodes 152 and gate electrode 154 of 2500 Å. The distance between the cathodes 152 and anode 156 averages 50 microns. Vacuum 164 is maintained in a space approximately 200 microns square by 50 microns (thick), for the present example, and other dimensions are possible.

FIGS. 12A and 12B show a horizontal three-electrode device 180 that has a structure that aligns a pair of field electron emission devices 182 with an anode 184 horizontally on the surface of a substrate 186. The difference between the horizontal three-electrode device 180 and the vertical three-electrode device 150 is that the anode 184 and a gate electrode 188 are fabricated on the same layer in device 180. Otherwise, the construction of device 180 is the same as the construction of device 150.

FIG. 13 illustrates a graph of the voltage-to-current (V-I) performance of vertical three-electrode device 150. (Cathode 152 is grounded and anode 156 voltage is constant at $V_{ak}=200$ V.) A pair of curves 190 and 192, respectively, plot the gate 154 voltage $V_{gk}$ versus gate 154 current $I_{gk}$ and anode current $I_{ak}$. Currents $I_{gk}$ and $I_{ak}$ increase exponentially with respect to $V_{gk}$, which indicates a Fowler-Nordheim tunnel current. Special note should be made of the fact that regardless of $V_{gk}$, the current ratio ($I_{ak}/I_{gk}$) is almost constant at thirty. When device 150 is controlled in the current mode, the output ($I_{ak}$) has a proportional relationship to the input ($I_{gk}$) and it becomes a linear current amplifier with a current amplification ratio of about thirty.

FIG. 14 illustrates a linear amplifier 200 that uses a vertical three-electrode device 202. A cathode 204 of device 202 is grounded and an anode supply 206 ($V_{ak}$) is connected to an anode 208 through a load resistance 210 ($R_L$). A bias source 212 establishes a DC bias current $I_i$ and a smaller signal current $i_i$ and is input to a gate 214 on device 202. These currents cause amplified voltages $V_o$ and $v_o$ (for $I_i$ and $i_i$, respectively) to appear across load resistance 210, for both device 150 and 180 when substituted for device 202. Such that:

$$V_o + v_o = -\alpha R_L(I_i + i_i)$$

$$= -\alpha R_L I_i - \alpha R_L i_i \quad (1)$$

Turning on and off of the gate voltage to device 202 can switch on and off the anode current. Device 202 can typically be used in audio power amplifiers and in the drive circuits of brushless motors. If anode 208 is made of copper (Cu), device 202 can be used as an x-ray source. Such an x-ray generating device can produce micro-beams of x-rays because it can reduce the x-ray wavelengths to tens of microns or less.

Seventh Embodiment

In FIG. 15, a luminous display device 210 arranges pixels, which are made of field electron emission device groups and a luminous layer 212, in an X-Y matrix arrangement. Each pixel is coordinated to form an entire luminous display. Luminous layer 212 emits light when electrons coming from the field electron emission device bombard it. Matrix luminous display device 210 comprises substrate 214 having on its surface a plurality of cathode lines 216 in stripes, a plurality of gate lines 218 that are arranged in a stripes at right angles to cathode lines 216, and a number of regions in which field electron emission device groups are fabricated. Device 210 further comprises an opposing substrate 220 which is arranged adjacent and facing substrate 214. Substrate 220 comprises an anode 222 and stacked luminous layer 212. Luminous layer 212 covers almost the entire surface of anode 222. A vacuum 224 is maintained in the space between the two substrates 214 and 220. Each pixel comprises a group of field electron emission devices and an adjacent luminous layer region that is illuminated by the electron emission. For example, in FIG. 15, a pixel having a matrix address m, n (at the m$^{th}$ gate line 218 and the n$^{th}$ cathode line 216) comprises a group of four field electron emission devices located within a rectangle having comers P, Q, R, and S. The corresponding part of luminous layer 212 has the perimeter of a rectangle formed by points P', Q', R', and S' on opposing substrate 220. Substrate 214 is a p-type single crystal silicon substrate and cathode lines 2 16 are made of an n-type layer of silicon fabricated on the surface of substrate 214. A plurality of cathodes 226 are fabricated on the surface of cathode lines 216 in the intersecting regions with gate lines 218. Cathodes 226, an insulating layer 228, and a plurality of gate electrode openings 230 are all fabricated by a process that is the same as that of the third embodiment disclosed above. Opposing substrate 220 is a transparent glass substrate. Anode 222 comprises such materials as ITO, to form a transparent conductive layer. (ITO is a transparent conductive film comprising In$_2$O$_3$+SnO$_2$.) The illumination of luminous layer 212 is transmitted through these substrates and is recognized from the direction of the opposing substrate 10. Matrix or array luminous display device 210 uses the multiplex drive method, which uses cathode line 216 (or gate line 218) as the segment line and gate line 218 (or cathode line 216) as a common line. Setting the drive voltage and waveform such that the electrical potential of the n-type silicon layer, i.e., cathode lines 216, does not go negative with respect to the p-type single crystal silicon substrate 214 is very important.

FIG. 16 illustrates a partial isometric drawing of an active matrix luminous display device 240 and FIG. 17 is a partial schematic of device 240. A plurality of thin-film transistors (TFTs) are fabricated for each visual display pixel. When a voltage is applied through each TFT to a gate electrode of a selected pixel, a corresponding display occurs. Device 240 comprises TFT gate lines 242 and TFT source lines 244, which are fabricated in a lattice configuration on the surface of a transparent substrate 246. Device 240 further comprises TFT 248 and a field electron emission device group that are fabricated at intersecting points and arranged in a matrix configuration. An anode 250 and a luminous layer 252 are stacked on the surface of an opposing substrate 254. Substrate 246 is positioned essentially parallel to substrate 254. A vacuum 256 is contained between substrates 246 and 254. The field electron emission device groups are produced in the same manner as disclosed above in the fourth embodiment. Each has a silicon thin-film layer 258 as a common cathode interconnect. Each TFT drain pin is connected to a gate electrode 260. The TFT gate pin of TFT 248 is connected to TFT gate line 242. The TFT source pin is connected to TFT source line 244. Polycrystalline silicon TFT, amorphous silicon TFT, or CdSe TFT can be used for the TFT material. Data voltage is applied to the TFT source line 244 and a selective voltage is applied to turn on the TFT at TFT gate line 242 (scan line). TFTs that align with this will turn on and the data voltage will be applied to gate electrode 260 of each pixel through the TFT channels. A pixel display will be created as a result of the data voltage, in luminous layer 252 from electrons emitted in sufficient quantities to provide the desired brightness. By scanning one pixel at a time, a complete pixel display will appear to form a raster similar to a television picture tube.

If red (R), green (G) and blue (B) luminous materials are arranged at each pixel in the luminous layer 252, a multiple-color or full-color luminous display device can be created. Moreover, the illumination of luminous layer 252 can be recognized from the direction of opposing substrate 254. If substrate 246 is either very fine or transparent a display will be visible from both sides of device 240. Luminous display device 240 in either monochrome or color versions has a low power consumption and a flat construction. Such a display is suitable as a portable display, such as, for flat, wall-mounted televisions, light-weight portable televisions, lap-top computers and palm-top computers. It may also be employed as an image light source for electronic view finders for portable VTRs, for projection display devices, used in alphanumeric displays, time displays for wrist watches, and display devices for game machines by configuring it as part of a 7-segment character display device or a special miniature display device.

Eighth Embodiment

FIGS. 18A and 18B illustrate a monochrome optical printer head 280. Individual pixels comprise a field electron emission device group and a corresponding portion of a luminous layer, and are arranged in rows. Optional pixels are lighted using a voltage applied to each gate electrode 282 or anode 284. Optical printer head 280 can easily be made into an RGB three-light source by placing three differently colored luminous materials (e.g., red, green, blue) in adjacent stripes. Control of the luminous levels of each pixel is typically accomplished with a discrete LSI chip (fabricated as a hybrid). Device 280 can be used as a monochrome optical source for photosensitive printers or as a color optical line source in color optical printers, e.g., xerography-type optical printers, silver-salt photography printers or light-sensitive coloring printers.

While the invention has been described in conjunction with several specific embodiments, it is evident to those skilled in the art that many further alternatives, modifications and variations will be apparent in light of the forgoing description. Thus, the invention described herein is intended to embrace all such alternatives, modifications, applications and variations as may fall within the spirit and scope of the appended claims.

What is claimed is:

1. An array field emission display device comprising:
    a first planar conductive layer,
    an insulating planar layer disposed on said first conductive planar layer,
    a second conductive layer disposed on said insulating layer,
    a plurality of field emitters formed in an orthogonal matrix in a plurality of gate electrode openings formed in said insulating layer,
    each of said field emitters comprising a cone-like cathode disposed in each of said gate electrode openings and having a base and a tip, said tip projecting upwardly from said base in each said gate electrode opening with said base being superjacent said first conductive layer,
    a plurality of gate electrodes formed from said second conductive layer for said field emitters, at least one gate electrode opening formed in each of said gate electrodes having a lip which is substantially concentric with each said cathode tip, said gate electrode lip extending into each said gate electrode opening forming a downwardly descending lip projection, and
    a planar anode disposed above said gate electrodes and said each cathode tip wherein said gate electrodes are selectively operable to control anode current.

2. The array field emission display device of claim 1 wherein adjacent of said field emitters are formed into separate field emission device groups wherein each of said groups comprises a pixel,
    said first planar conductive layer comprises single crystal silicon or tantalum,
    said gate electrodes formed in parallel rows extending in a first direction across said insulating layer and having a plurality of said gate electrode openings,
    a plurality of cathode electrodes formed in parallel rows extending in a second direction and disposed beneath parallel rows of said field emission device cathodes in said first planar conductive layer,
    said first and second directions substantially formed at fight angles,
    a luminous layer formed on a surface of said planar anode facing said gate electrodes and said each cathode tip,
    said pixels being matrix addressable via selective addressing of said gate and cathode electrodes.

3. The array field emission display device of claim 2 wherein said first planar conductive layer comprises a substrate.

4. The array field emission display device of claim 2 wherein said first planar conductive layer comprises a thin film.

5. The array field emission display device of claim 1 wherein each of said gate electrodes is disposed individually about each of said field emitters,
    a plurality of parallel rows of source lines extending in a first direction across said insulating layer between adjacent rows of said field emitters,
    a plurality of parallel rows of gate lines extending in a second direction across said insulating layer between adjacent rows of said field emitters,
    said first and second directions substantially formed at right angles,
    a TFT device formed on said insulating layer adjacent each of said field emitters and having either a first source domain or a first drain domain connected to said gate, a second drain domain or a second source domain, respectively, connected to a respective TFT source line and a gate electrode connected to a respective gate line.

6. The array field emission display device of claim 5 wherein adjacent of said field emitters are formed into separate field emission device groups wherein each of said groups comprises a pixel, a luminous layer formed on a surface of said planar anode facing said gate electrodes and said each cathode tip, the number of each of said field emitters within a pixel group selectively addressed to control amount of brightness developed light at said luminous layer relative to a corresponding area thereof for each of said pixels.

7. The array field emission display device of claim 6 wherein said corresponding pixel areas of said luminous layer each comprise luminous materials of the primary colors so that overall color of each of said pixels can be selectively controlled.

8. The array field emission display device of claim 1 comprising an optical printer head utilized for forming an light sensitive image in a photosensitive type printer.

* * * * *

UNITED STATES PATENT AND TRADEMARK OFFICE
CERTIFICATE OF CORRECTION

PATENT NO. : 5,448,132
DATED : September 5, 1995
INVENTOR(S) : Hiroshi Komatsu

It is certified that error appears in the above-indentified patent and that said Letters Patent is hereby corrected as shown below:

On the title page: Item

[30] Foreign Application Priority Data

Nov. 20, [90]   [JP]   Japan .................................................. 2-315472
Dec. 18, [89]   [JP]   Japan .................................................. 1-327621

Signed and Sealed this

Sixteenth Day of January, 1996

Attest:

BRUCE LEHMAN

Attesting Officer          Commissioner of Patents and Trademarks